(12) United States Patent
Kimura

(10) Patent No.: US 11,635,795 B2
(45) Date of Patent: Apr. 25, 2023

(54) POWER SUPPLY SYSTEM AND POWER SUPPLYING METHOD FOR DETECTING A SHORT CIRCUIT IN THE FEEDBACK

(71) Applicant: DENSO CORPORATION, Kariya (JP)

(72) Inventor: Masao Kimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 336 days.

(21) Appl. No.: 16/985,921

(22) Filed: Aug. 5, 2020

(65) Prior Publication Data
US 2021/0041931 A1 Feb. 11, 2021

(30) Foreign Application Priority Data

Aug. 7, 2019 (JP) .............................. JP2019-145310

(51) Int. Cl.
| | | |
|---|---|---|
| *H02H 7/12* | (2006.01) | |
| *G06F 1/28* | (2006.01) | |
| *G01R 31/58* | (2020.01) | |
| *G01R 31/52* | (2020.01) | |
| *H02M 1/00* | (2006.01) | |

(52) U.S. Cl.
CPC ............... *G06F 1/28* (2013.01); *G01R 31/52* (2020.01); *G01R 31/58* (2020.01); *H02H 7/1213* (2013.01); *H02M 1/0003* (2021.05)

(58) Field of Classification Search
CPC .... H02H 7/1213; H02H 11/005; H02H 1/003; H02M 1/0003; G01R 31/52; G01R 31/58; G06F 1/28
See application file for complete search history.

(56) References Cited

U.S. PATENT DOCUMENTS

| | | | |
|---|---|---|---|
| 2003/0042485 A1 | 3/2003 | Ooishi | |
| 2012/0013367 A1* | 1/2012 | Chen .................... | H02H 7/1213 327/87 |
| 2013/0335862 A1* | 12/2013 | Xie ........................ | H02H 3/202 361/18 |
| 2014/0160804 A1* | 6/2014 | Sato .................. | H02M 3/33507 363/21.01 |
| 2016/0268908 A1* | 9/2016 | Chang ............... | H02M 3/33523 |
| 2017/0077695 A1* | 3/2017 | Li ........................... | H02M 1/32 |
| 2018/0367027 A1* | 12/2018 | Chen ....................... | H02M 1/36 |
| 2019/0107854 A1* | 4/2019 | Hayashi .................. | G05F 1/562 |
| 2019/0229516 A1* | 7/2019 | Shigehara ............ | H02H 7/1213 |

FOREIGN PATENT DOCUMENTS

| | | |
|---|---|---|
| JP | H11-225429 A | 8/1999 |
| JP | 2003-274655 A | 9/2003 |

* cited by examiner

*Primary Examiner* — Harry R Behm
(74) *Attorney, Agent, or Firm* — Maschoff Brennan

(57) ABSTRACT

A power supply system includes first and second power supply lines to respectively connect positive and negative electrode terminals of a load with a main power supply. First and second voltage detection lines are respectively connected to the first and second power supply lines via first and second resistances. First and second inspection power supplies respectively supply power and provide potential differences to the first and second voltage detection lines from the first and second power supply lines. Occurrence of a short circuit in one of the first and second voltage detection lines is recognized when corresponding one of the first and second inspection power supplies supplies power and a difference between a preset voltage and a voltage caused between the first and second voltage detection lines is a threshold value or more.

5 Claims, 8 Drawing Sheets

POWER SUPPLY SYSTEM AND POWER SUPPLYING METHOD FOR DETECTING A SHORT CIRCUIT IN THE FEEDBACK

CROSS-REFERENCE TO RELATED APPLICATION

This patent application is based on and claims priority to Japanese Patent Application No. 2019-145310, filed on Aug. 7, 2019 in the Japan Patent Office, the entire disclosure of which is hereby incorporated by reference herein.

BACKGROUND

Technical Field

The present disclosure relates to a power supply system and a power supplying method.

Related Art

In recent years, with an increase in number of added functions and amount of data to be processed, an increasing amount of power is required to operate electronic devices. Then, a technology capable of detecting a short circuit occurring in a voltage detection line has been demanded.

SUMMARY

With an increase in number of added functions and amount of data to be processed, an increasing amount of power is required to operate electronic devices, for example, as discussed in Japanese Patent Application Laid Open No. 2003-77295 (JP-2003-77295-A). Thus, when power for operating the electronic devices is increasingly needed, a drop in voltage sometimes occurs in a power supply line for supplying power from a power supply to a load. Accordingly, such a voltage drop needs to be inhibited. As a countermeasure against the voltage drop, a remote sensing technology is known, in which a voltage between both ends of a load is detected and feedback control is performed to control an input voltage input thereto.

In such a remote sensing technology, detection of a short circuit occurring in a voltage detection line that detects a voltage between both ends of a load is not thoroughly considered. Hence, a technology capable of detecting the short circuit occurring in the voltage detection line has been demanded.

Accordingly, one aspect of the present disclosure provides a novel power supply system (10) for receiving power from a main power supply (20) and powering a load. The power supply system includes first and second power supply lines (PL, NL) respectively connected to positive and negative electrode terminals of the load, first and second voltage detection lines (PD, ND) respectively connected to the first and second power supply lines, and a feedback controller (120) to detect a voltage between both ends of the load via the first and second voltage detection lines. The feedback controller performs feedback control by controlling an input voltage input to the load based on the voltage between both ends of the load. The power supply system also includes first and second wirings (WL1, WL2) respectively connected to the first and second voltage detection lines, and first and second inspection power supplies (CC1, CV2) to respectively provide potential differences to the voltage detection lines from the power supply lines connected to the first and second voltage detection lines. The first and second inspection power supplies are disposed on the first and second wirings (WL1, WL2), respectively. The power supply system further includes a power supply controller (200) to control the power supply system. The power supply controller designates a preset voltage. The power supply controller recognizes a short circuit occurring in one of the first and second voltage detection lines provided with the potential difference by selectively activated one of the first and second inspection power supplies when a difference between a preset voltage and an inspection voltage is a threshold value or more. The inspection voltage is caused between the first and second voltage detection lines when one of the first and second inspection power supplies is selectively activated and supplies power to corresponding one of the first and second voltage detection lines.

Another aspect of the present disclosure provides a novel method of controlling supplying of power to a load. The method includes the steps of: receiving power from a main power supply; powering the load via first and second power supply lines; and detecting a voltage between both ends of the load via first and second voltage detection lines connected to the first and second power supply lines, respectively. The method further includes the steps of: performing feedback control by controlling an input voltage input to the load based on the voltage between both ends of the load; selectively actuating one of first and second inspection power supplies to supply power and provide a potential difference to corresponding one of the first and second voltage detection lines from corresponding one of the first and second power supply lines; and calculating a first voltage as a preset voltage caused between the first and second voltage detection lines when a short circuit is not occurring in each, and one of the first and second inspection power supplies is selectively activated to supply power and provide the potential difference to corresponding one of the first and second voltage detection lines. The method further includes the steps of: calculating a second voltage caused between the first and second voltage detection lines when a short circuit is occurring in one of the first combination of the first power supply line and the first voltage detection line and the second combination of the second power supply line and the second voltage detection line, and corresponding one of the first and second inspection power supplies is selectively activated to supply power and provide the potential difference to corresponding one of the first and second voltage detection lines; designating a threshold value greater than 0 (zero) and less than a difference between the preset voltage and the second voltage; and detecting an inspection voltage caused between the first voltage detection line and the second voltage detection line when the one of first and second inspection power supplies is selectively activated. The method further includes the step of recognizing a short circuit occurring in one of the first and second voltage detection lines selectively provided with the potential difference when a difference between the preset voltage and the inspection voltage caused between the first and second voltage detection lines is the threshold value or more.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Figure 1:
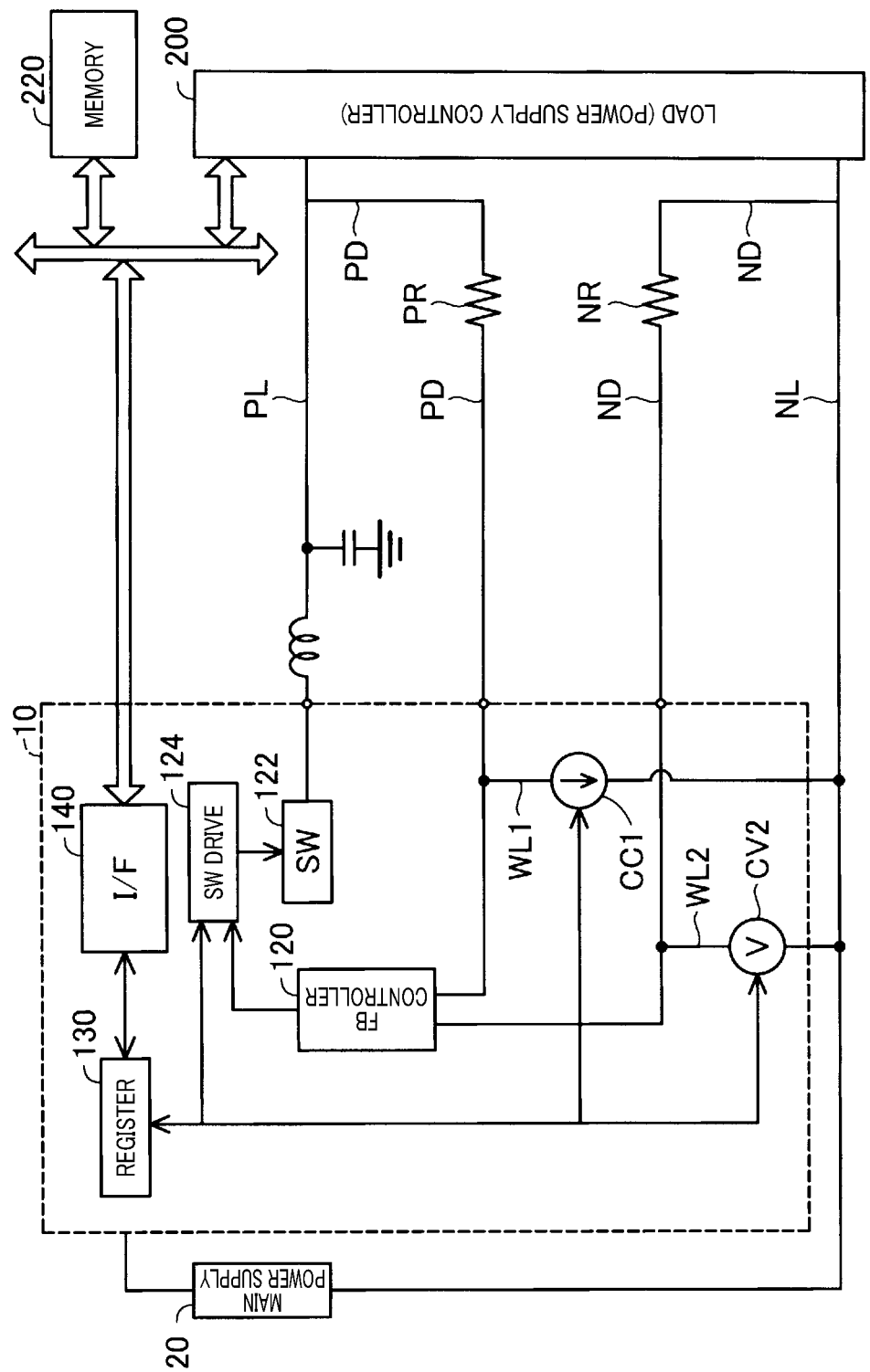
FIG. 1 is a diagram illustrating a schematic configuration of a power supply system according to a first embodiment of the present disclosure.

Referring now to the drawings, wherein like reference numerals designate identical or corresponding parts throughout the several views thereof, and to FIG. 1, a first embodiment is hereinafter described. That is, as shown in FIG. 1, a system for supplying power to a controller as a load 200 includes a power supply unit 10, a main power supply 20 and a power supply line PL. The system for supplying power also includes a power supply line NL, a voltage detection line PD and a voltage detection line ND. The system for supplying power also includes a wiring WL1 and a wiring WL2. In this embodiment, the controller as a load 200 acts as a control unit to control the power supply unit 10. That is, the controller as a load 200 receives power supply from the power supply unit 10 and controls the power supply unit 10.

The main power supply 20 acts as a power supply for supplying power to the controller as a load 200. The power supply unit 10 receives power from the main power supply 20 and converts it into a lower voltage power and powers the controller as a load 200. Specifically, the power supply unit 10 is configured as an IC (Integrated Circuit) to perform power supply control.

The power supply line PL connects a positive electrode side of the power supply unit 10 with a positive electrode side of the controller as a load 200. The power supply line NL also connects a negative electrode side of the power supply unit 10 with a negative electrode side of the controller as a load 200.

Further, the voltage detection line PD is connected to the power supply line PL. A voltage detection line ND also is connected to the power supply line NL. These voltage detection lines PD and ND are wirings to detect a voltage between both ends of the controller as a load 200. Hence, between the voltage detection lines PD and ND, a detection resistance (not shown) used in detecting the voltage between both ends of the controller as a load 200 is connected to each of these lines.

Further, the power supply unit 10 also includes a switching element 122, a switching drive circuit 124 and a feedback controller 120. The power supply unit 10 also includes a register (i.e., memory) 130, an interface 140 and a constant current power supply CC1. The power supply unit 10 further includes a constant voltage power supply CV2.

The switching element 122 is placed on the power supply line PL. The switching element 122 performs high-speed switching by using an FET (Field effect Transformer). Further, as shown, on the power supply line PL, a coil and a capacitor connected to the ground are provided as a system for achieving voltage conversion. With these configurations, an output voltage of the main power supply 20 is converted into a lower voltage. Further, the switching drive circuit 124 controls the switching element 122.

Further, the feedback controller 120 controls the switching drive circuit 124. Specifically, the feedback controller 120 detects a voltage between both ends of the controller as a load 200 via the voltage detection lines PD and ND and performs feedback control to control an input voltage input to the controller as a load 200 based on the voltage. For example, when the voltage between both ends of the controller as a load 200 becomes lower than a target voltage, the feedback controller 120 outputs a signal to instruct the switching drive circuit 124 to increase an input voltage input thereto. Hereinbelow, the feedback controller 120 is sometimes simply referred to as an FB control unit 120.

Further, the voltage detection lines PD and ND include resistances PR and NR, respectively. Each of the resistances PR and NR is formed by a wiring pattern. Hence, the FB controller 120 detects the voltage between both ends of the controller as a load 200 by taking an amount of voltage drop caused by each of the resistances PR and NR into account, and performs feedback control to control an input voltage input thereto.

Further, the register 130 keeps various information designated and used in the power supply unit 10 and a result of determination performed in the later described short-circuit determination process. The power supply unit 10 is connected to the controller as a load 200 via the interface 140. Hence, the controller as a load 200 controls the power supply unit 10 through a bus and the interface 140 in the power supply unit 10.

Further, the constant current power supply CC1 is disposed on a wiring WL1. The wiring WL1 is connected to a point of the voltage detection line PD, closer to a resistance PR disposed on the voltage detection line PD than to the power supply line PL.

The constant current power supply CC1 provides a potential to a connection portion (junction) between the voltage detection line PD and the wiring WL1 different from that of the power supply line PL, thereby flowing a constant current into the voltage detection line PD. That is, the constant current power supply CC1 supplies the constant current in a direction indicated by an arrow as shown in FIG. 1. The constant current power supply CC1 is controlled by the controller as a load 200.

Further, the constant voltage power supply CV2 is provided on the wiring WL2. The wiring WL2 is connected to a point of the voltage detection line ND, closer to a resistance NR disposed on the voltage detection line ND than to the power supply line NL. The constant voltage supply CV2 provides a potential to a connection portion (junction) between the voltage detection line ND and the wiring WL2 different from that of the power supply line NL. The constant voltage supply CV2 is enabled to keep a voltage of the voltage detection line ND constant relative to the power supply line NL when the power supply line NL and the voltage detection line ND are not short-circuited. The constant voltage supply CV2 is controlled by the controller as a load 200.

Further, to operate the controller as a load 200, power is supplied from the power supply unit 10 to the controller as a load 200 via the power supply lines PL and NL. At this time, a voltage between both ends of the controller as a load 200 is detected via the voltage detection lines PD and ND, and the FB controller 120 performs feedback control to control an input voltage input to the controller as a load 200 based on the voltage as detected.

Further, the controller as a load 200 is connected to a memory 220 and the power supply unit 10 via a bus. The memory 220 is composed of a ROM (Read Only Memory) and a RAM (Random Access Memory).

The controller as a load 200 executes a short-circuit determination process as described later with reference to FIG. 2. Specifically, the controller as a load 200 acts as a processer and reads computer programs for a short-circuit determination process from the ROM in the memory 220 and loads the program into the RAM in the memory 220. The controller as a load 200 then runs the computer program. Here, the short-circuit determination process is performed to determine whether a short circuit has occurred in one of the voltage detection lines PD and ND as a target voltage detection line.

Now, the short-circuit determination process performed for the voltage detection line PD will be herein below described with reference to FIG. 2. That is, when the short-circuit determination process is started, the constant current power supply CC1 is activated and supplies a constant current to the wiring WL1 in step S310. Here, while the constant current power supply CC1 is operating, the controller as a load 200 provides an instruction to the feedback controller 120 to direct the feedback controller 120 to detect and monitor a voltage of the power supply line PL in order to prevent fluctuation of the voltage of the power supply line PL.

Figure 3:
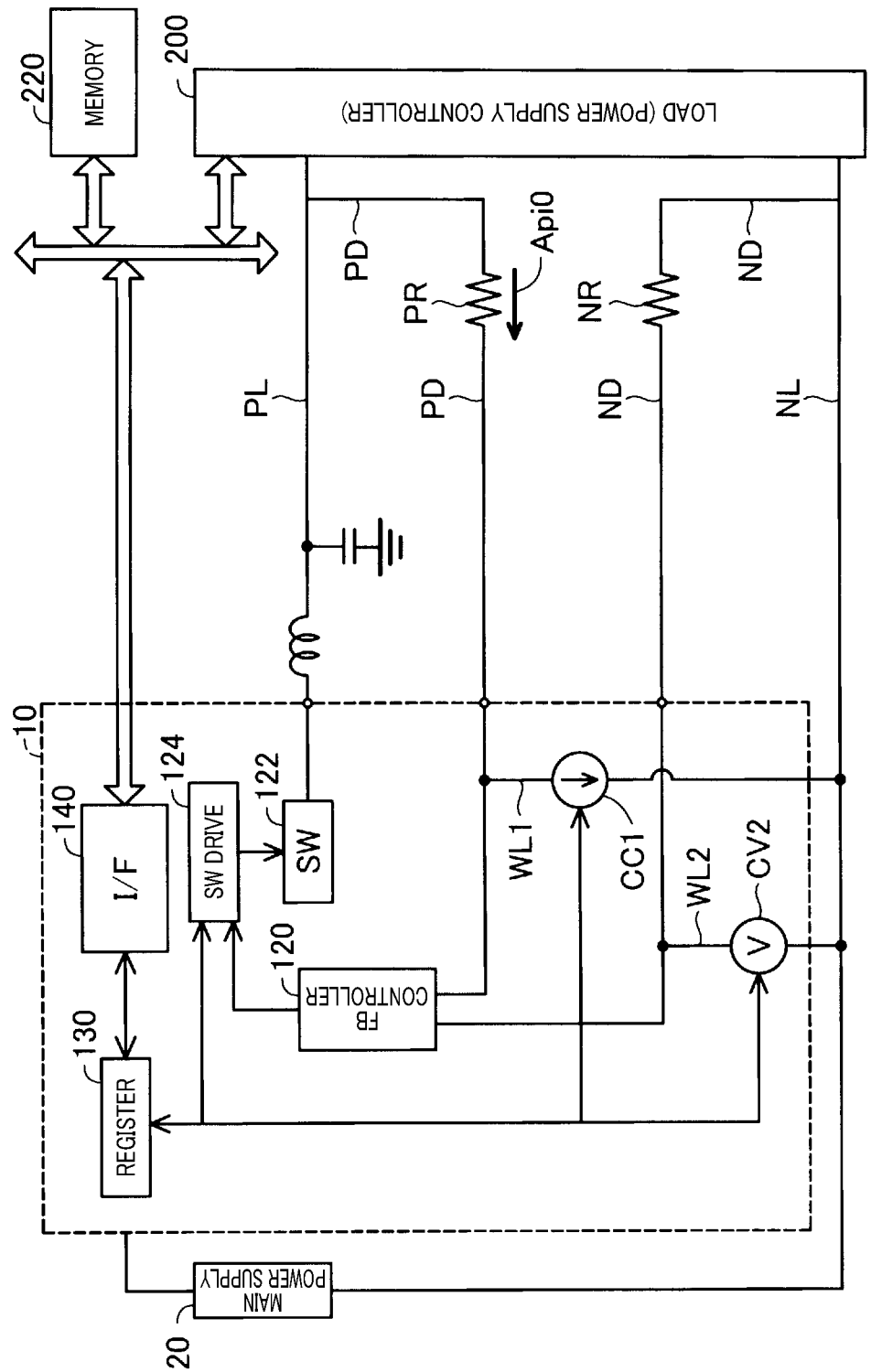
FIG. 3 is a diagram illustrating a flow of constant current according to the first embodiment of the present disclosure.

Further, as shown in FIG. 3, a flow of constant current generated when the power supply line PL and the voltage detection line PD are not short-circuited is indicated by arrow Api0. That is, when the power supply line PL and the voltage detection line PD are not short-circuited, a constant current flows through the voltage detection line PD from the power supply line PL via the resistance PR.

Figure 4:
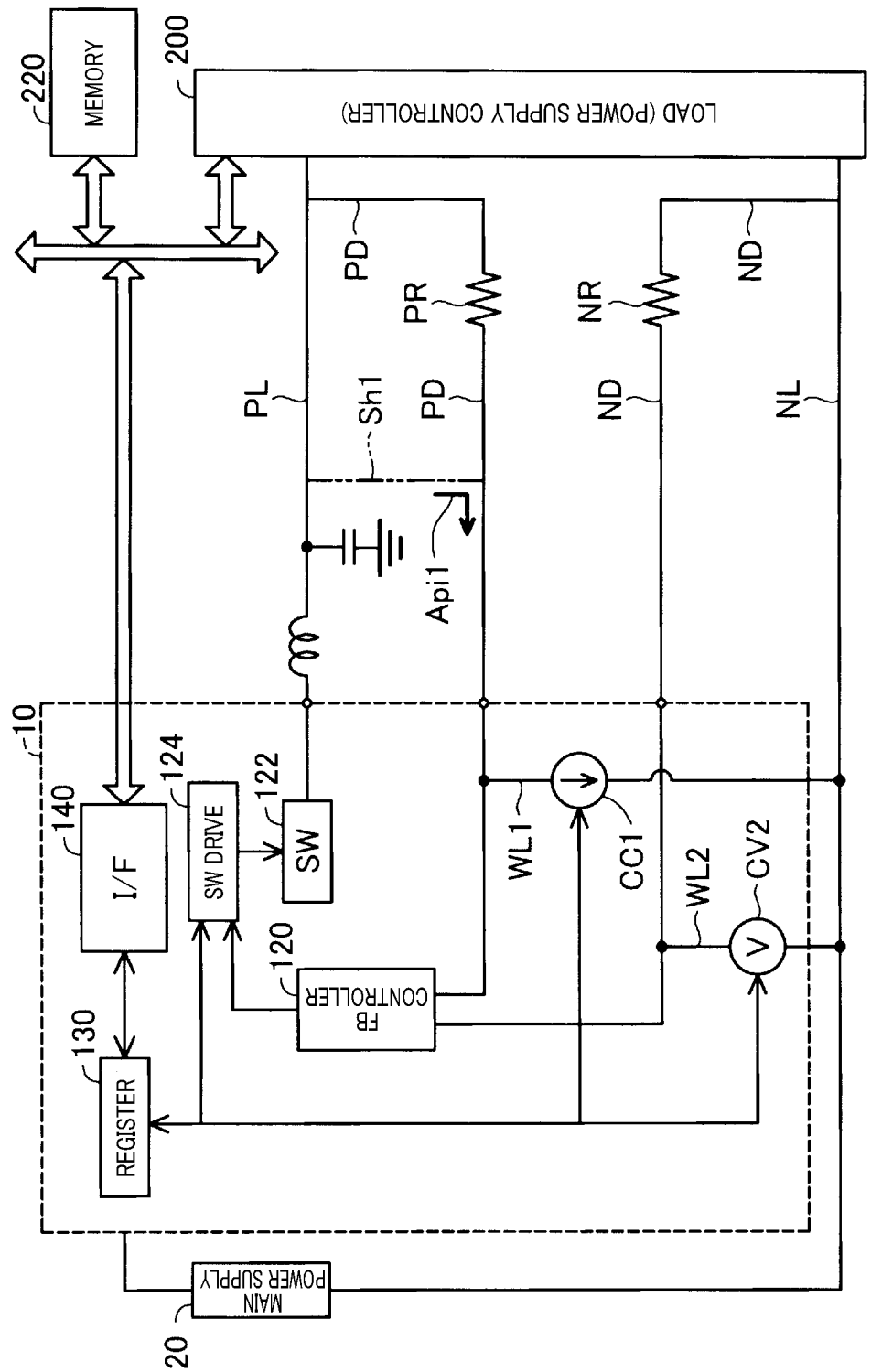
FIG. 4 is a diagram illustrating another flow of constant current according to the first embodiment of the present disclosure.

Further, as shown in FIG. 4, a flow of constant current generated when the power supply line PL and the voltage detection line PD are short-circuited is indicated by arrow Api1. That is, as shown in FIG. 4, when the short-circuit path Sh1 is formed between the power supply line PL and the voltage detection line PD, a current flows through the voltage detection line PD through the short circuit path Sh1 without flowing through the resistance PR. Hence, when the short circuit path Sh1 is formed, a voltage drop generally caused by a current passing through the resistance PR does not occur.

Figure 2:
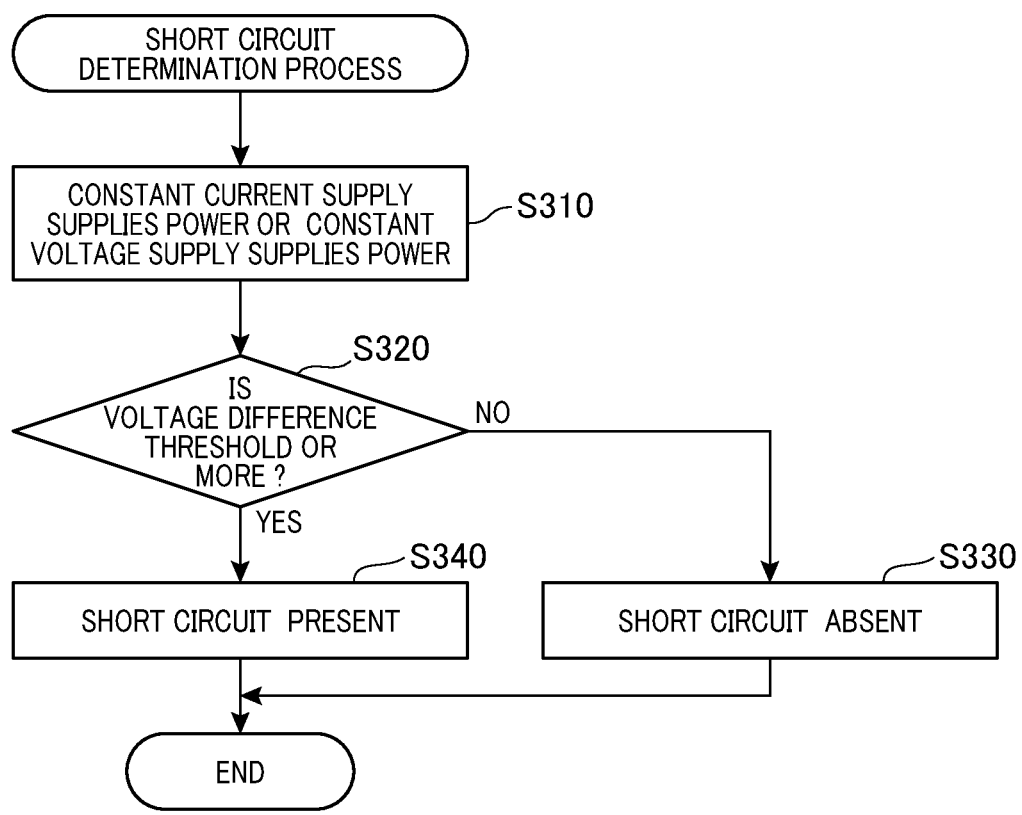
FIG. 2 is a flowchart illustrating a short-circuit determination process according to the first embodiment of the present disclosure.

Now, an exemplary short-circuit determination process according to a first embodiment of the pin is specifically described with ref to FIG. 2. First, a current is supplied from the constant current power supply CC1 (or the constant voltage power supply CV2) in step S310. Then, the controller as a load 200 determines whether a difference between a preset voltage and a difference in voltage caused between the voltage detection lines PD and ND when the current flows from the constant current power supply CC1 is a threshold or more (in step 320). As the preset voltage, a voltage caused between the voltage detection lines PD and ND when a short circuit does not occur between the power supply line PL and the voltage detection line PD and a constant current is supplied from the constant current power supply CC1 is designated. Further, as the threshold, a given voltage value is designated, which is less than a difference between the preset voltage and a difference in voltage expected to be caused between the voltage detection lines PD and ND when the power supply line PL and the voltage detection line PD are short-circuited and a constant current is supplied (i.e., flows) from the constant current power supply CC1. However, the threshold voltage value is greater than 0 (zero).

Further, if the difference in voltage is determined not to be equal to or higher than the threshold value (No, in step S320), the controller as a load 200 determines that the voltage detection line PD provided with the potential difference and a flow of the constant current is not short-circuited in step S330. Subsequently, the short-circuit determination process is terminated. By contrast, if the difference in voltage is the threshold or more (Yes, in step S320), the controller as a load 200 determines that the voltage detection line PD having the potential difference and a flow of the constant current is short-circuited in step S340. Subsequently, the short-circuit determination process is terminated.

Further, similar to the above-described short-circuit determination process performed for the voltage detection line PD, a short-circuit determination process is also performed for the voltage detection line ND as well. Specifically, the short-circuit determination process for the voltage detection line ND is performed substantially in the same manner as the short-circuit determination process performed for the voltage detection line PD except for a preset voltage and a threshold as used in step S320.

Specifically, as a preset voltage used in the short-circuit determination process for the voltage detection line ND, a voltage caused between the voltage detection lines PD and ND when the power supply line NL and the voltage detection line ND are not short-circuited and the constant voltage supply CV2 supplies power is designated. Further, as a threshold designated in the short-circuit determination process for the voltage detection line ND, a smaller value than a difference between the preset voltage and a voltage caused between the voltage detection lines PD and ND when the voltage detection line ND and the power supply line NL are short-circuited and the constant voltage supply CV2 supplies power. However, the threshold is greater than 0 (zero).

Now, a short-circuit determination process performed for the voltage detection line ND is herein below specifically described with ref to FIG. 2. As shown, when the short-circuit determination process is started, the constant voltage supply CV2 supplies power, so that a potential difference is caused between the voltage detection line ND and the power supply line NL in step S310. Here, while the constant voltage power supply CV2 supplies power, the controller as a load 200 provides an instruction to the feedback controller 120 to detect and monitor a voltage of a power supply line NL in order to ensure that the voltage of the power supply line NL does not fluctuate due to activation of the constant voltage power supply CV2.

Figure 5:
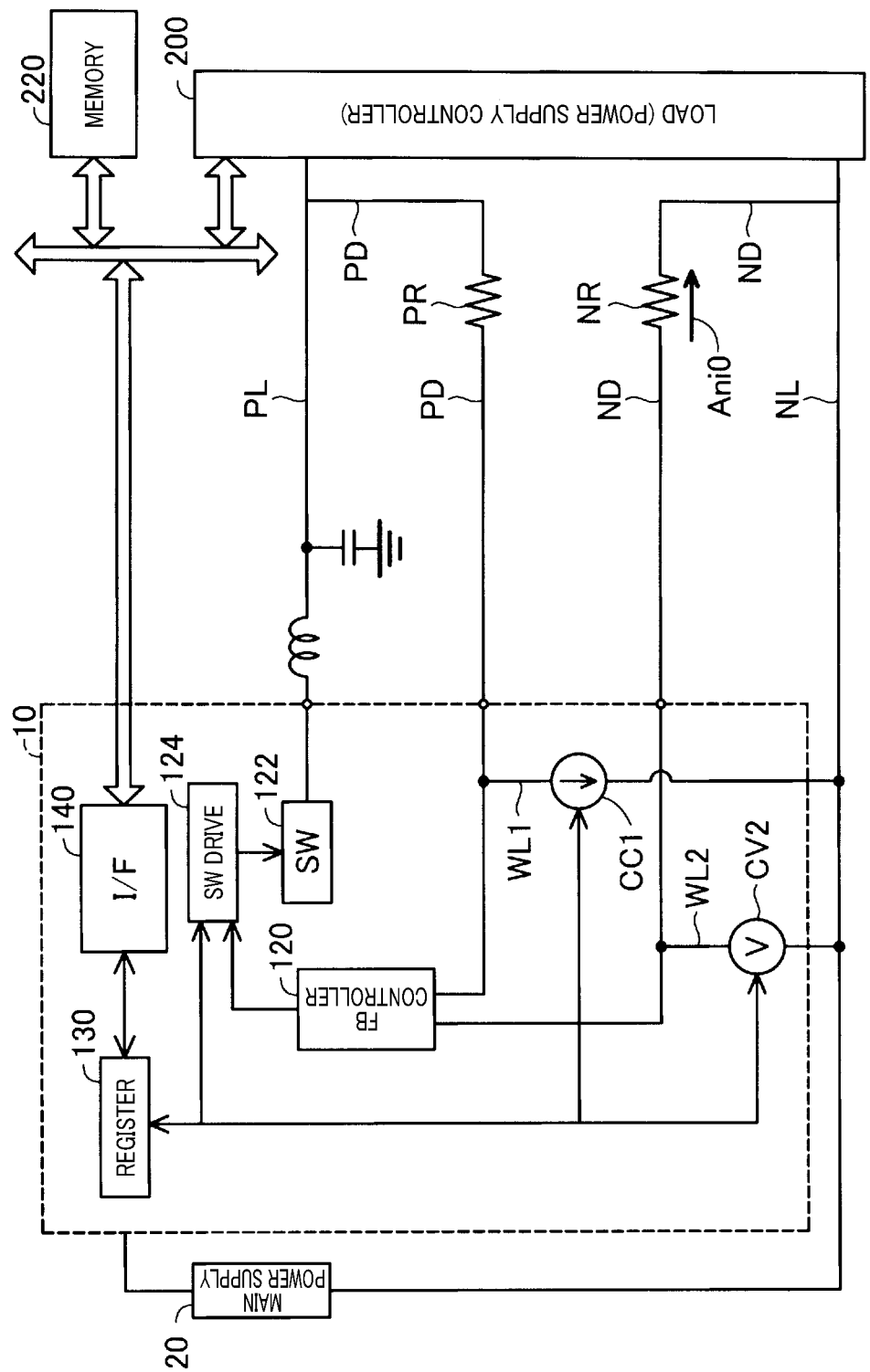
FIG. 5 is a diagram illustrating a path in which a voltage drop occurs according to the first embodiment of the present disclosure.

Further, as shown in FIG. 5, a path, in which a voltage drops when the power supply line NL and the voltage detection line ND are not short-circuited is indicated by arrow Ani0.

Figure 6:
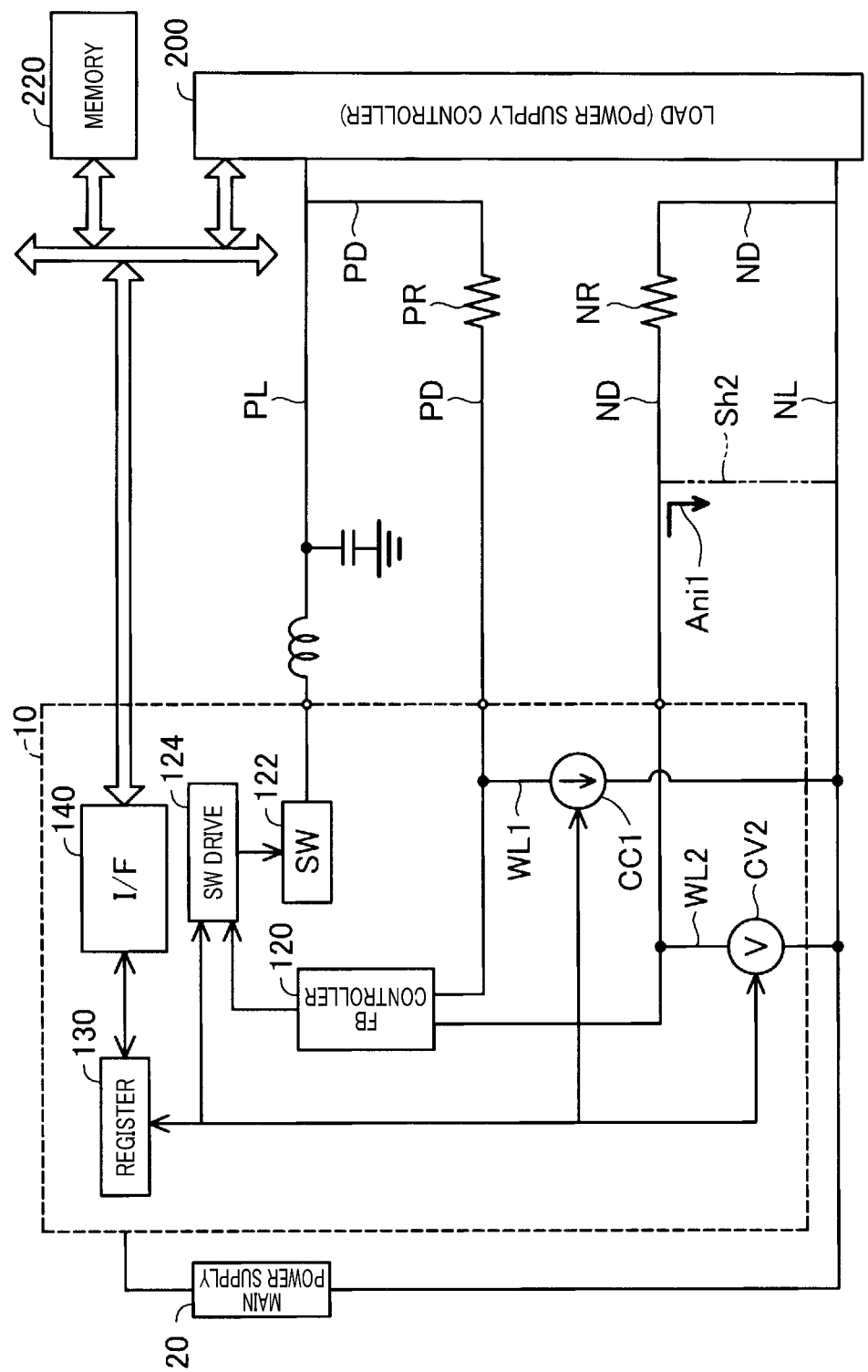
FIG. 6 is a diagram illustrating another path in which a voltage drop occurs according to the first embodiment of the present disclosure.

By contrast, as shown in FIG. 6, a path in which a voltage drops when the power supply line NL and the voltage detection line ND are short-circuited is indicated by arrow Ani1. Specifically, as shown, when the power supply line NL and the voltage detection line ND are short-circuited thereby forming a short circuit path Sh2 between the power supply line NL and the vol detection line ND, a voltage passes through the short circuit path Sh2 rather than the resistance NR. Hence, if the short-circuit path Sh2 is formed, a voltage drop generally caused when a current flows through the resistance NR does not occur.

Further, after the constant voltage supply CV2 supplies power in step S310, the FB controller 120 determines whether a difference between the preset voltage and a difference in voltage caused between the voltage detection lines PD and ND when the const vol power supply CV2 supplies power is the threshold or more in step S320. Subsequently, processes after step S330 are performed substantially in the same manner as in the short-circuit determination process performed for the voltage detection line PD.

As described heretofore, according to the above-described first embodiment, a short circuit formed in one of the voltage detection lines PD and ND provided with the potential difference from the power supply line can be detected. Hence, based on a confirmation of no short circuit being present, remote sensing can be performed. Hence, a situation in which remote sensing is inaccurately performed, and accordingly the controller as a load 200 operates based on an unrecommended operating voltage can be either reduced or prevented.

Figure 7:
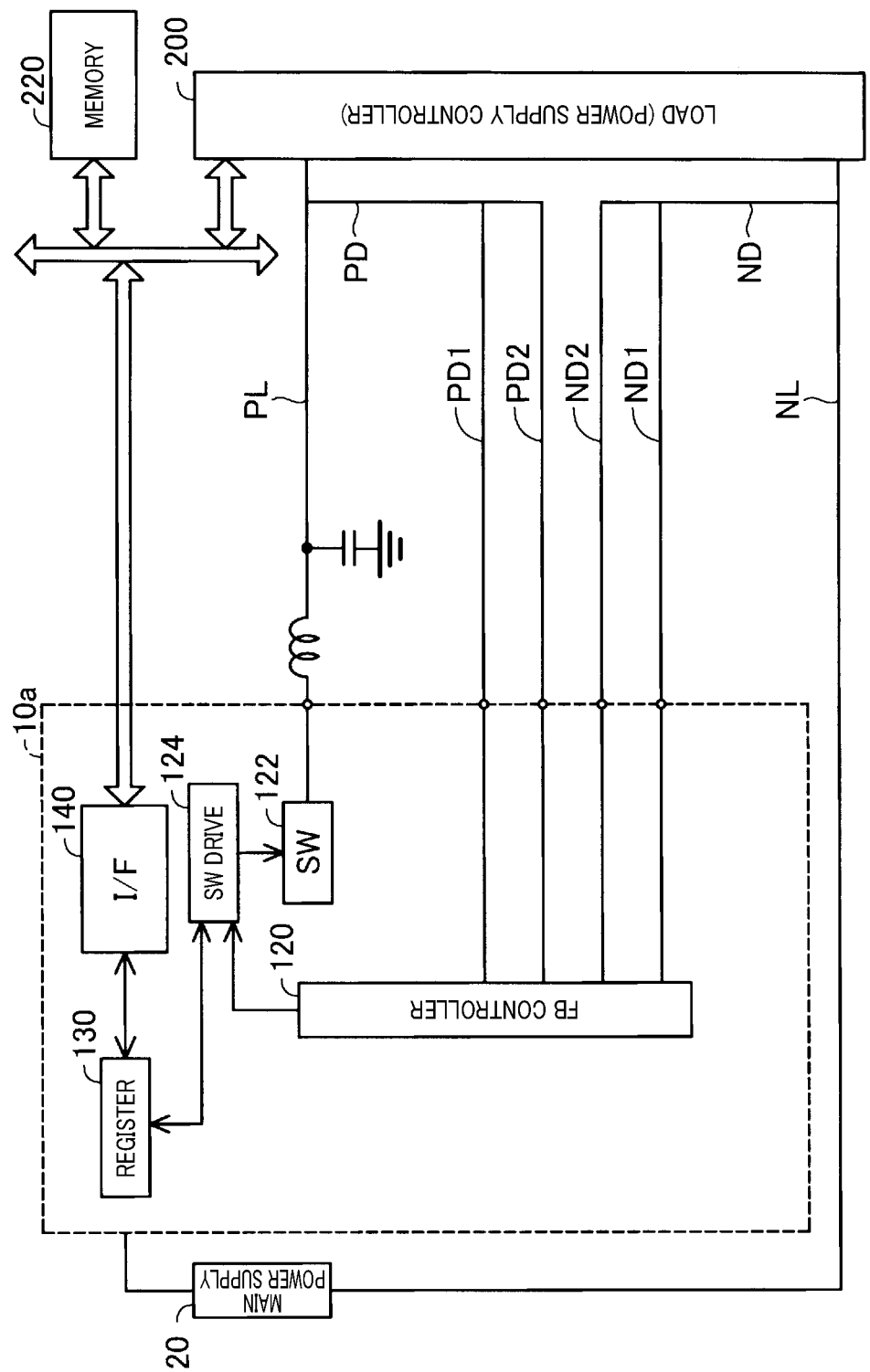
FIG. 7 is a diagram schematically illustrating a configuration of another power supply system according to a second embodiment of the present disclosure.

Now, a second embodiment is hereinbelow described with reference to FIG. 7. That is, as shown in FIG. 7, a power supply unit 10a is shown as another embodiment. Specifically, the power supply unit 10a is substantially the same as the power supply unit 10 of the first embodiment except that the wirings WL1 and WL2, the constant current power supply CC1 and the constant voltage power supply CV2 employed in the first embodiment are omitted. Further, a configuration of each of voltage detection lines PD and ND in this embodiment is different from those employed in the first embodiment. Herein below, the same reference numeral as used in the first embodiment indicates the same configuration and descriptions thereof are to be referred thereto.

Specifically, it is substantially the same as the first embodiment because one end of the voltage detection line PD is connected to a power supply line PL. However, it is different from the first embodiment because the other end of the voltage detection line PD is branched off into voltage detection lines PD1 and PD2. Similarly, it is substantially the same as the first embodiment because one end of the voltage detection line ND is connected to a power supply line NL. However, it is different from the first embodiment because the other end of the voltage detection line ND is branched off into voltage detection lines ND1 and ND2 as well. Hence, according to this embodiment, the controller as a load 200 is enabled to determine whether the voltage detection lines PD1 and ND are short-circuited or the voltage detection lines PD2 and ND2 are short-circuited by comparing a voltage between the voltage detection lines PD1 and ND1 with a voltage between the voltage detection lines PD2 and ND2 when power is supplied to the controller as a load 200.

Hence, according to this embodiment, the constant current power supply CC1 and the constant voltage power supply CV2 acting as inspection power supplies can be omitted. By contrast, according to the first embodiment, configurations of the voltage detection lines PD and ND can be simplified when it is compared with this embodiment described with reference to FIG. 7. Hence, according to the first embodiment, the number of terminals of the power supply unit 10 for connecting to wirings can be reduced.

Figure 8:
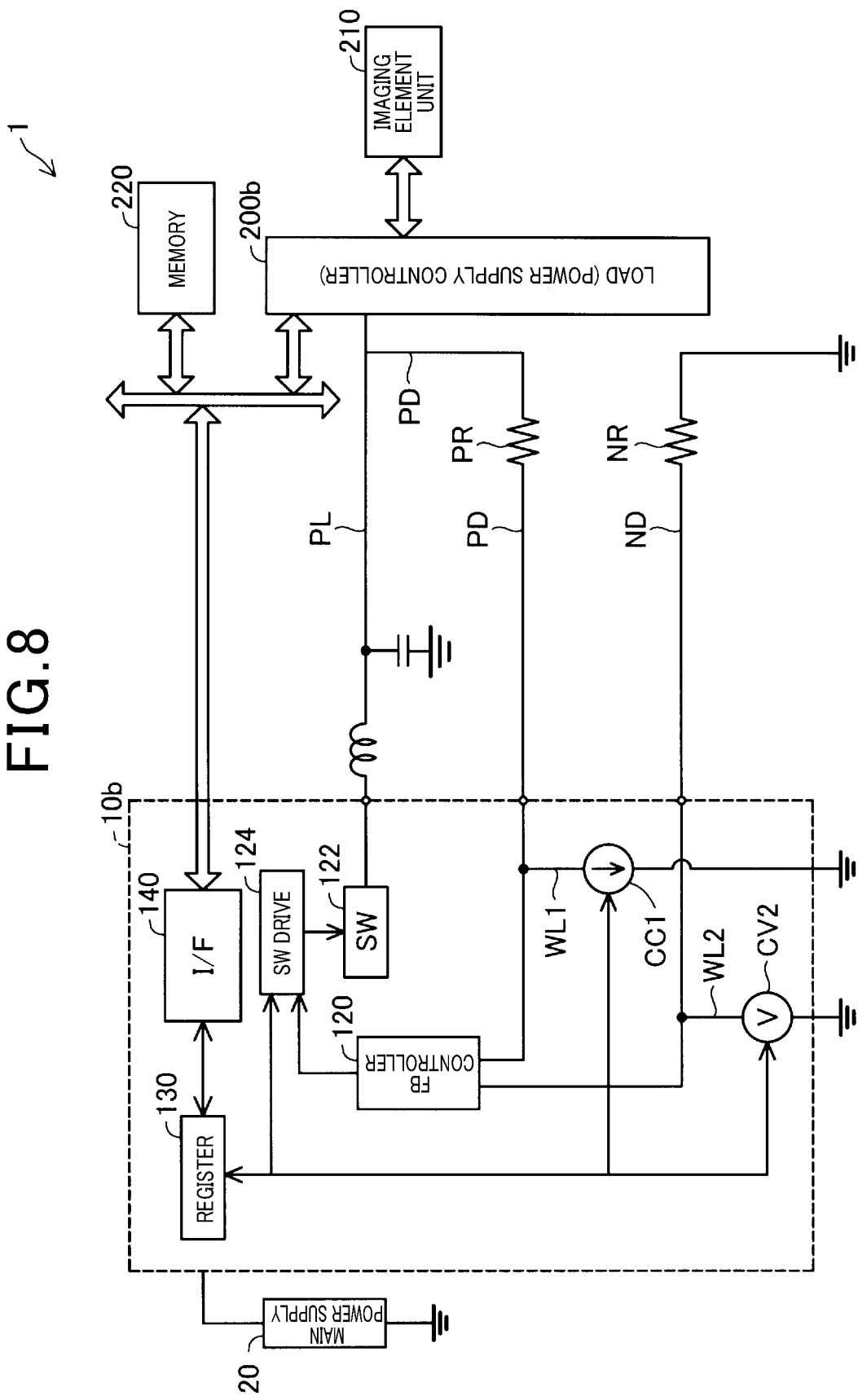
FIG. 8 is a diagram schematically illustrating a configuration of a camera module according to a third embodiment of the present disclosure.

Now, a third embodiment of the present disclosure is herein below described with reference to FIG. 8. As shown in FIG. 8, a camera module 1 including a power supply unit 10b is shown. Specifically, the camera module 1 is mounted on a car to capture external information as image data and perform image recognition. A result of the image recognition is utilized to automatically drive a car.

Herein below, the same reference numeral is used for a component employed in the camera module 1 to perform substantially the same function as a component of the first embodiment shown in FIG. 1 as the reference numeral attached to the component of the first embodiment. However, components that perform substantially the same functions as the corresponding components of the first embodiment shown in FIG. 1 are not repeatedly described. Further, a suffix "b" is added to the end of a reference numeral indicating a component in this embodiment functionally corresponding to a component with the reference numeral in the first embodiment shown in FIG. 1.

Specifically, the camera module 1 includes a power supply unit 10b, an imager unit 210 and a memory 220. The camera module 1 also includes a module controller acting as a load 200b.

The imager unit 210 includes multiple imagers arranged in two dimensions. Each of the imager is composed of a semiconductor device that converts a light into an electrical signal upon receiving the light.

Further, the module controller as a load 200b acts as a processor for performing image recognition by receiving signals from the imager unit 210. More, specifically, the module controller as a load 200b is composed of a SoC (System on a Chip). Also, the module controller as a load 200b serves as a load and is a target to which the power supply unit 10b supplies power (similar to the controller as a load 200 shown in FIG. 1). Further, the module controller as a load 200b also acts a control unit for controlling the power supply unit 10b as well. Further, the module controller as a load 200b realizes various functions including image recognition by running computer program stored in the memory 220.

However, the camera module 1 does not include the power supply line NL in contrast to the first embodiment (see a lower part of FIG. 1). That is, in the camera module 1, each of a voltage detection line ND, wirings WL1 and WL2, and the main power supply 20 is connected to the ground in place of the power supply line NL of FIG. 1. Hence, in the camera module 1, the ground serves as the power supply line NL as employed in FIG. 1.

Further, the power supply unit 10b supplies power to multiple components included in the camera module 1 including the module controller as a load 200b. Specifically, although a circuit is not specifically shown in FIG. 8, the power supply unit 10b also supplies power to the imager unit 210 and the memory 220 as well.

Hence, in the camera module 1 with the above-described configuration, a short-circuit determination process shown in FIG. 2 is performed as described hereinbelow with reference to FIG. 2 and applicable drawings.

Specifically, in a short-circuit determination process, if a difference between the preset voltage and a difference in voltage caused between the voltage detection lines PD and ND when a constant current flows from the constant current power supply CC1 is the threshold value or more, a short circuit is determined to be occurring in the voltage detection line PD in steps S320 and S340 (also see FIG. 4). Similarly, if a difference between the preset voltage and another difference in voltage caused between the voltage detection lines PD and ND when the constant voltage power supply CV2 supplies power is the threshold value or more, a short circuit is determined to be occurring in the voltage detection line ND in steps S320 and S340 (also see FIG. 6). Such determination results in the short-circuit determination process are stored in the register 130 (see FIG. 8).

Further, the module controller as a load 200b reads a determination result of the short-circuit determination process stored in the register 130, and stops operation of the camera module 1 if the determination result represents that a short circuit has occurred. As a result, a situation in which remote sensing is inaccurately performed, and accordingly the module controller as a load 200b operates based on an unrecommended operating voltage can be either reduced or prevented.

Recently, remote sensing that enables power supplying to a SoC (System on a Chip) of a vehicle-mounted camera module based on a recommended operating voltage is also demanded to be used in automatic driving. Also, in the future, since performance of image recognition used in automatic driving will be further improved, demand for accurate and reliable remote sensing for the SoC is expected to further increase. However, even in such a situation, according to the power supply system of this embodiment, a short-circuit determination process can be advantageously performed for voltage detection lines PD and ND used in performing the remote sensing of the module controller as a load 200b in the camera module 1. That is, the above-described demand can be met by this embodiment.

Heretofore, the short-circuit determination process for determining a presence of a short-circuit in a circuit for supplying power from the power supply unit 10b to the module controller as a load 200b is described. However, a similar short-circuit determination process for determining a short-circuit in a circuit for supplying power from the power supply unit 10b to the imager unit 210 and the memory 220 can be similarly performed by adopting substantially the same configuration.

Furthermore, in the future, when a lower power consumption memory, such as a LPDDR (Low Power Double Data Rate) 5 etc., is employed for the memory 220 in the vehicle-mounted camera module, the demand for accurate and reliable remote sensing for the memory 220 is expected to further increase. However, even in such a situation, such demand can be advantageously met by performing the short-circuit determination process for a voltage detection line used in remote sensing for the memory 220 of the camera module 1.

Herein below, various modifications of the present disclosure are described. First, in the above-described first embodiment, the resistances PR and 0R are formed by the wiring pattern. However, the present disclosure is not limited thereto. For example, the resistances PR and NR can be formed by chip resistances. In such a situation, these resistances PR and NR formed by the chip resistances tend to cause a significantly voltage drop when compared to the resistances PR and NR formed by the wiring patterns. Hence, a difference between a voltage caused between the voltage detection lines PD and ND when a short circuit does not occur and a voltage caused between the voltage detection lines PD and ND when a short circuit occurs can be increased.

Further, in the above-described embodiments, each of the power supply units 10,10a and 10b supplies power to each of the corresponding controllers 200 and 200b as loads (see FIGS. 1, 7 and 8). However, as described earlier, each of the power supply units 10,10a and 10b can supply power to a load other than the control units which control the corresponding power supply units 10,10a and 10b. In such a situation, the short-circuit determination process of FIG. 2 can be performed for the other load when power is not supplied to the controller as the load 200. For example, the short-circuit determination process of FIG. 2 is preferably performed for the other load before power is supplied to the controller as the load 200. In such a situation, supplying power to the controller as a load 200 is stopped by a relay provided in either the main power supply 20 or each of the power supply units 10,10a and 10b.

Further, in the above-described embodiment, each of the power supply units 10,10a and 10b includes the constant voltage power supply CV2. However, in a situation where the power supply line NL is provided, a constant current power supply CC2 having substantially the same configuration as the constant current power supply CC1 can be employed instead of the constant voltage power supply CV2. In such a situation, a short-circuit determination process (see FIG. 2) of determining a presence of a short-circuit between the voltage detection line ND and the power supply line NL is performed in substantially the same manner as the short-circuit determination process of determining a presence of a short-circuit between the voltage detection line PD and the power supply line PL.

Further, in the above-described embodiment, a portion of a configuration realized by hardware can be replaced with software. Conversely, a portion of a configuration realized by software may be replaced with hardware. For example, in the above-described embodiment, a CPU (Central Processing Unit) acts as the controller as a load 200 (see FIGS. 1 and 3 to 8) and reads and runs computer program, thereby realizing various functions. However, some or all of functions realized by the control unit can be realized by a hardware circuit. Further, the feedback controller 120 (see FIGS. 1 and 3 to 8) can be realized as either a hardware circuit or a processor implementing software. Further, each of the control units can be configured as a processor for realizing various processes.

Numerous additional modifications and variations of the present disclosure are possible in light of the above teachings. It is therefore to be understood that within the scope of the appended claims, the present disclosure may be performed otherwise than as specifically described herein. For example, the present disclosure is not limited to the above-described power supply system and may be altered as appropriate. Further, the present disclosure is not limited to the above-described power supplying method and may be altered as appropriate.

What is claimed is:

1. A power supply system for receiving power from a main power supply and powering a load, the power supply system comprising:
    first and second power supply lines to respectively connect positive and negative electrode terminals of the load with the main power supply;
    first and second voltage detection lines, each of which has opposing first and second ends, the first ends of the first and second voltage detection lines being connected to the respective first and second power supply lines;
    a feedback controller connected to the second ends of the respective first and second voltage detection lines, the feedback controller being configured to:
        detect a voltage between the positive and negative electrode terminals of the load via the first and second voltage detection lines; and perform feedback control by controlling an input voltage input to the load based on the detected voltage between the positive and negative electrode terminals of the load;

first and second inspection power supplies respectively disposed on first and second wirings respectively connected to the first and second voltage detection lines, the first and second inspection power supplies being selectively activated, the first inspection power supply supplying power and providing a first potential difference to the first voltage detection line from the first power supply line when actuated, the second inspection power supply supplying power and providing a second potential difference to the second voltage detection line from the second power supply line when actuated; and a power supply controller to control the power supply system, wherein when a selected one of the first and second inspection power supplies is activated to provide a corresponding one of the first and second potential differences to a corresponding one of the first and second voltage detection lines, the power supply controller recognizes a short circuit occurring in the selected one of the first and second voltage detection lines when determining that a difference between a preset voltage and an inspection voltage is a threshold value or more, the inspection voltage being caused between the first and second voltage detection lines with the corresponding one of the first and second potential differences being provided to the selected one of the first and second voltage detection lines.

2. The power supply system as claimed in claim 1, wherein the first and second voltage detection lines respectively include first and second resistances, the first inspection power supply, when actuated, provides the first potential difference to the first voltage detection line from the first power supply line by providing current flowing through the first resistance, and the second inspection power supply, when actuated, provides the second potential difference to the second voltage detection line from the second power supply line by providing current flowing through the second resistance.

3. The power supply system as claimed in claim 1, wherein the preset voltage is a first voltage caused between the first and second voltage detection lines when:

the short circuit is not occurring in each of a first combination of the first power supply line and the first voltage detection line and a second combination of the second power supply line and the second voltage detection line, and the selected one of the first and second inspection power supplies is activated to supply power and provide the corresponding one of the first and second potential differences to the corresponding one of the first and second voltage detection lines, the threshold value is greater than 0 (zero) and less than a difference between the preset voltage and a second voltage, the second voltage being caused between the first and second voltage detection lines when:

the short circuit is occurring in one of the first combination of the first power supply line and the first voltage detection line and the second combination of the second power supply line and the second voltage detection line; and the selected one of the first and second inspection power supplies is activated to supply the power and provide the corresponding one of the first and second potential differences to the corresponding one of the first and second voltage detection lines.

4. The power supply system as claimed in claim 3, wherein the power supply controller recognizes the short circuit by determining that the inspection voltage is the second voltage or more.

5. A method of controlling supplying of power to a load having positive and negative electrode terminals, comprising:

receiving power from a main power supply;

powering the load via first and second power supply lines;

detecting a voltage between positive and negative power supply lines of the load via first and second voltage detection lines connected to the first and second power supply lines, respectively;

performing feedback control by controlling an input voltage input to the load based on the detected voltage between the positive and negative electrode terminals of the load;

selectively actuating one of first and second inspection power supplies to supply power and provide a first potential difference to the corresponding one of the first and second voltage detection lines from the corresponding one of the first and second power supply lines;

calculating a first voltage as a preset voltage caused between the first and second voltage detection lines when a short circuit is not occurring in each of a first combination of the first power supply line and the first voltage detection line and a second combination of the second power supply line and the second voltage detection line;

calculating a second voltage caused between the first and second voltage detection lines when a short circuit is occurring in one of the first combination of the first power supply line and the first voltage detection line and the second combination of the second power supply line and the second voltage detection line;

designating a threshold value greater than 0 (zero) and less than a first difference between the preset voltage and the second voltage;

detecting an inspection voltage caused between the first voltage detection line and the second voltage detection line when the one of first and second inspection power supplies is selectively activated; and recognizing the short circuit occurring in one of the first and second voltage detection lines selectively provided with the potential difference when a second difference between the preset voltage and the inspection voltage caused between the first and second voltage detection lines is the threshold value or more.

* * * * *